United States Patent [19]

Reich

[11] Patent Number: 5,041,414
[45] Date of Patent: Aug. 20, 1991

[54] SUPERCONDUCTOR COMPOSITE

[75] Inventor: Shymon Reich, Rehovot, Israel

[73] Assignee: Yeda Research and Development Company Limited, Rehovot, Israel

[21] Appl. No.: 309,366

[22] Filed: Feb. 13, 1989

[30] Foreign Application Priority Data

Feb. 18, 1988 [IL] Israel ........................................ 85461

[51] Int. Cl.$^5$ ............................................ H01L 39/12
[52] U.S. Cl. ............................................ 505/1; 419/19;
419/21; 419/35; 419/39; 419/57; 428/403;
428/614; 428/930
[58] Field of Search ................. 505/1; 419/19, 21, 35,
419/39, 57; 428/403, 614, 930

[56] References Cited

U.S. PATENT DOCUMENTS 4,762,754 8/1988 Nellis et al. ......................... 428/552
4,892,861 1/1990 Ray ........................................ 75/232

FOREIGN PATENT DOCUMENTS 300215 7/1987 European Pat. Off. .

Primary Examiner—Stephen J. Lechert, Jr.
Attorney, Agent, or Firm—Browdy and Neimark

[57] ABSTRACT

Continuous malleable superconductive material which can be machined, rolled and soldered, being the product of sintering at an elevated temperature and pressure of a metal plated powder of a compound $QBa_2Cu_3O_{7-x}$ wherein Q is yttrium or europium, where x is smaller than one. The metal is advantageously silver and the plating process is one without the use of electricity. A preferred range of silver content is about 5 to 32 weight per cent, and the silver forms an essentially continuous phase in the superconductive material. Sintering can be done at from about 350° and 950° C., with a preferred range of 400° to 900° C. The superconductive material of the invention exhibits transition to zero-resisitivity state and the Meissner effect.

7 Claims, 7 Drawing Sheets

SUPERCONDUCTOR COMPOSITE

FIELD OF THE INVENTION

The invention relates to continuous bodies of superconducting material, which can be given a desired shape and which can be easily soldered and machined by a variety of means. The invention relates more specifically to the production of superconducting materials from fine grains of superconducting ceramic materials which have been plated by a chemical process with a desired metal, such as silver, and which are subsequently shaped to a desired form by application of pressure and a sintering process. The novel products have numerous advantages over simple shaped products obtained from unplated ceramic powder.

BACKGROUND OF THE INVENTION

Recently there have been made considerable efforts to impart to the novel superconductor (s.c.) ceramic materials some metallic properties to improve the mechanical properties of these s.c.. Properties such as machineability, moldability, metal wetting properties (soldering) may improve considerably by preparing a composite material of a s.c. and metal. Some of the attempts reported in the literature to achieve such properties are characterized by a random mixing of metal and s.c. powder to form a composite (1,2) which is subsequently sintered at high temperature. To create an interpenetrating network of metal in the composite, above the percolation threshold, a considerable volume fraction of the metal is necessary. According to the present invention, a new, non-random approach for the preparation of s.c. metal composite is presented. These new materials comprise micro grains of a ceramic superconductor (such as Y $Ba_2Cu_3O_7$) which are coated with a thin metal film and subsequently sintered at high temperature (450° C.-900° C.) to form a superconducting composite. Already at a very low metal loading of about 5% by volume, far below the percolation limit for the metallic component in random mixtures, a continuous honeycomb-like structure is created in which the grains of the ceramic material are nested.

Ceramics of the type $QBa_2Cu_{7-x}$ where Q designates yttrium or europium essentially of the prescovite structure can be obtained in the form of ceramic pellets when fired at an appropriate elevated temperature, exhibit both the Meissner effect and a transition to a zero-resistivity state when cooled to a temperature below $T_c$—94° K. With the yttrium compound the firing ought to be at about 940° C. When such pellets are crushed to a powder and reconstituted to a pellet by the application of pressure at ambient temperature, the Meissner effect is recovered whereas the transition to zero-resistivity state is lost. The overall conductivity behavior as function of temperature of such reconstituted pellets is that of a semiconductor. It is of great practical importance to be able to convert such materials to superconducting products which can be machined, rolled and soldered. It is furthermore of extreme practical importance to be able to provide such materials in a form which is flexible and not brittle.

SUMMARY OF THE INVENTION:

The invention relates to a process for the production of bodies of superconductive material, which can be soldered and which can be machined and rolled. The invention further relates to superconductive materials which can be given various shapes and which can be used for various applications of superconductors.

The novel products exhibit both the transition to zero-resistivity state and the Meissner effect. The superconductivity is exhibited at a temperature below about 94° K.

DETAILED DESCRIPTION OF EMBODIMENTS

The novel products are produced from metal-plated powders of superconductors of the type $QBa_2Cu_3O_{7-x}$, where Q designates yttrium or europium, or a mixture of these, and where x is smaller than one. The plating material of choice is silver, although also other plating materials having similar properties can be utilized. The process for preparing continuous superconducting sintered bodies of the type defined above comprises plating ceramic particles of a compound $QBa_2Cu_3O_{7-x}$, as defined above, with a suitable metal, such as silver, in a current-less plating process, forming a body from such plated particles by subjecting same to a suitable pressure and sintering at an elevated temperature (in the 300° C. to 950° C. range) under an atmosphere of oxygen or which contains an adequate oxygen content so as to form a solid in which there exists an essentially continuous metal (silver) phase The plating, in the case of silver, is advantageously effected from a system of silver nitrate with a reducing agent, the plating process being completed within a brief period of time. The plated powder has a suitable silver content so as to allow the formation of an essentially continuous metal phase during the sintering process Experiments have shown that satisfactory results can be obtained with a silver content of about 5 to 32 weight percent of silver The pressure applied during the formation of the compact bodies according to the invention is of the order of about 10 ton/cm$^2$. The compact body may be in the form of a thin flexible sheet; such a flexible sheet may in turn be supported by a suitable flexible support. The sintering process is preferably performed under a flow of oxygen or oxygen-containing gas, and this results in a compaction of the product, and in a substantial increase of density, such increase being of the order of about 20 per cent. For example, sintering increased the density from about 5.2 to 5.25 to about 6.03 to about 6.08 after sintering. The sintered material, when the coating is with silver, has a silver color. It can be machined with ease and it is possible to attach a wire by standard soft soldering procedures. The material can also be rolled. The following examples illustrate the invention. These are to be construed in a non-limitative manner. The starting material was a powder of the formula $QBa_2Cu_3O_{7-x}$ where Q designates Y or Eu, or a mixture of these, and where x is smaller than one. The particle size was of the order of some microns.

The plating process was effected as follows:
Solution A: $AgNO_3$ (60 g dm$^{-3}$)
Solution B: $NH_4NO_3$ (90 g dm$^{-3}$)
Solution C: NaOH (105 g dm$^{-3}$)

Solution D: Sucrose $C_{12}H_{22}O_{22}$ (100 g) and tartaric acid (5 g) are dissolved and boiled in 800 cm³ of water for 15 minutes. After cooling, add 150 cm³ of ethanol and make the total volume to 1 dm³.

Figure 1:
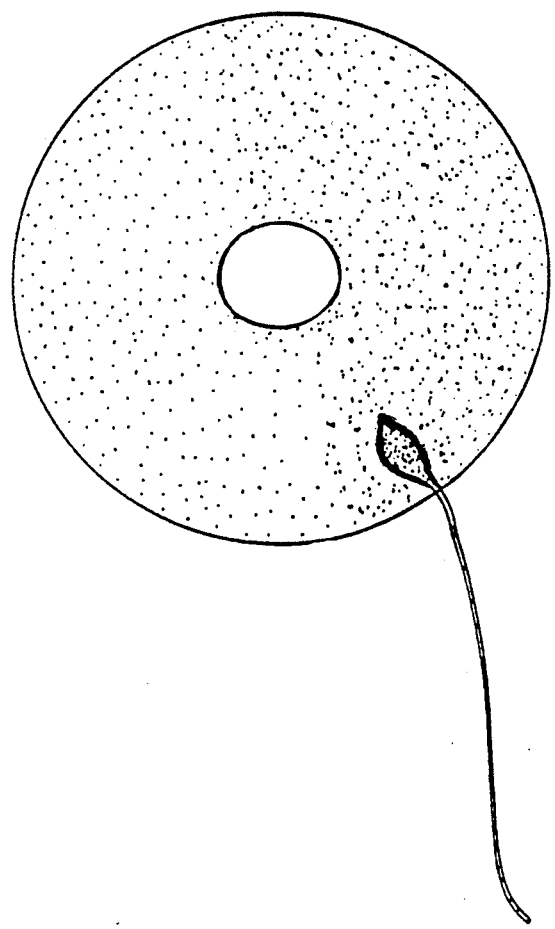
FIG. 1 illustrates a product in disc form according to the present invention.

Mix equal volumes of A and B, then, with stirring, add sufficient C. to give a permanent, faint grey-brown tinge to the solution. Mix with the ceramic powder, add a volume of D equal to one third of the volume of A used, and plate immediately at room temperature. Plating is complete within a few minutes. The plated powder is rinsed several times with ethanol and then dried in air, it contains 10 -32% by weight silver, It is then pressed into a pellet under a pressure of 10 tons/cm². The pellet is then kept for 3 hours at 450° under flowing oxygen. The resulting material exhibits the Meissner effect and will carry a super current $T<T_c$. To prove the last point the pellet was drilled at its center to form a ring. This ring was introduced into a glass Dewar vessel into a magnetic field (−2000 gauss) perpendicular to the plane of the ring. The ring is then cooled to 77° K. with liquid nitrogen. The field was switched off and the ring was transferred close to a Hall probe apparatus, a signal due to magnetic field resulting from a supercurrent in the ring was detected as long as the temperature of the ring was kept below −94° K. The density of the material after the sintering process was increased by 20%. (For example, 5.22 g cm³ before the heat treatment at 940° C. to 6.06 g cm³ after the sintering was completed). The sintered material has a silver color and can be easily machined Standard soft soldering process is readily performed on its surface. FIG. 1 illustrates a disk 13 mm in diameter which is drilled at its center. Note the wire which is soldered to the ring by a standard soft soldering process.

EXAMPLE 1

Figure 2A:
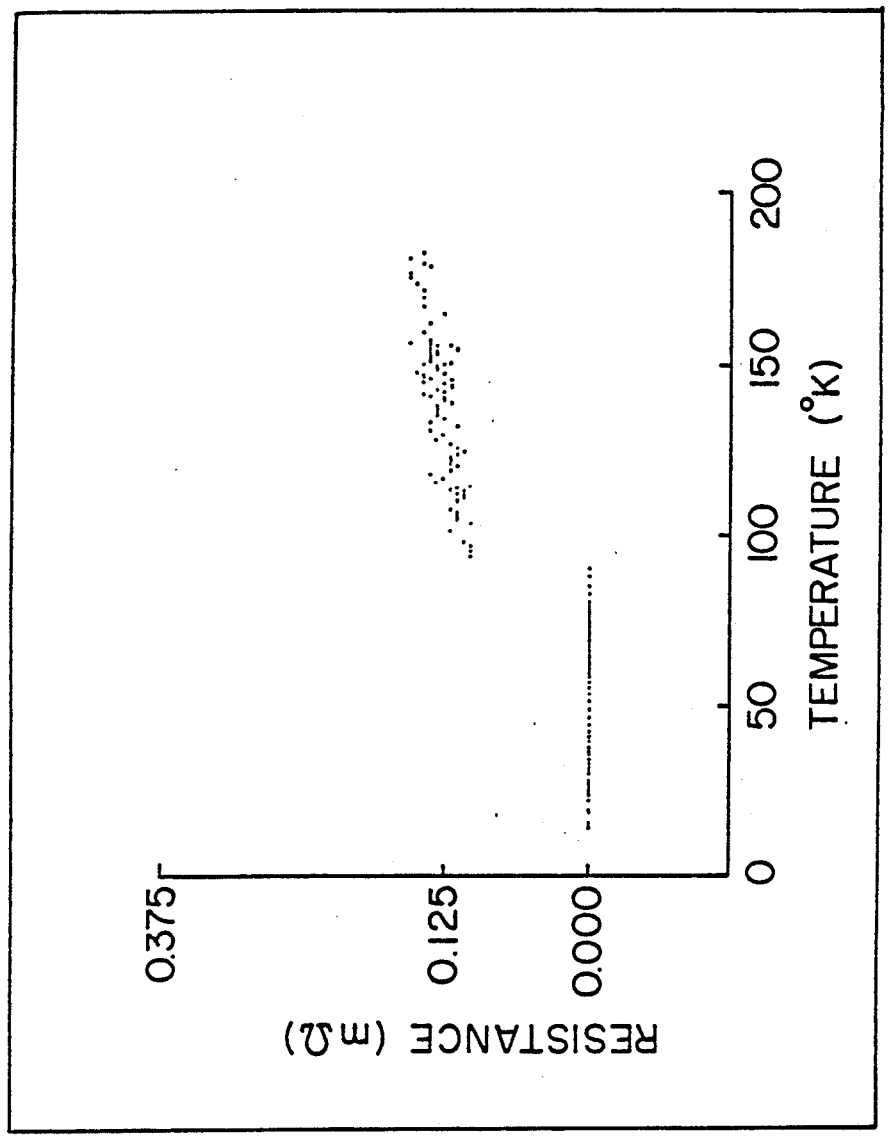
FIG. 2a and 2b are graphs related to Example 1.

A disk 1 mm thick and 13 mm is diameter was prepared by pressing a powder of Y $Ba_2Cu_3O_{7-x}$ (YBCO) plated with silver into a pellet form. This pellet was subsequently sintered in an oxygen rich atmosphere at 500° C. for four hours. The resulting composite material containing 20% by weight silver was tested for superconductivity in a four probe experiment. This experiment was performed in the temperature range between 20° K–190° K, using a current of 85 mA. A sharp transition to the zero resistance state was observed at 93±1° K see FIG. 2a. For T>94° K., in the normal state, the observed specific resistivity was $-2\times 10^{-4}$ Ωcm. This value of specific resistivity is −10 times smaller than that quoted in the literature for random silver and $Bi_4Sr_3Ca_2Cu_4O_{16-x}$ powder composites ($-3\times 10^{-3}$ Ωcm) containing 20% by weight of silver, see reference #(2).

Figure 2B:
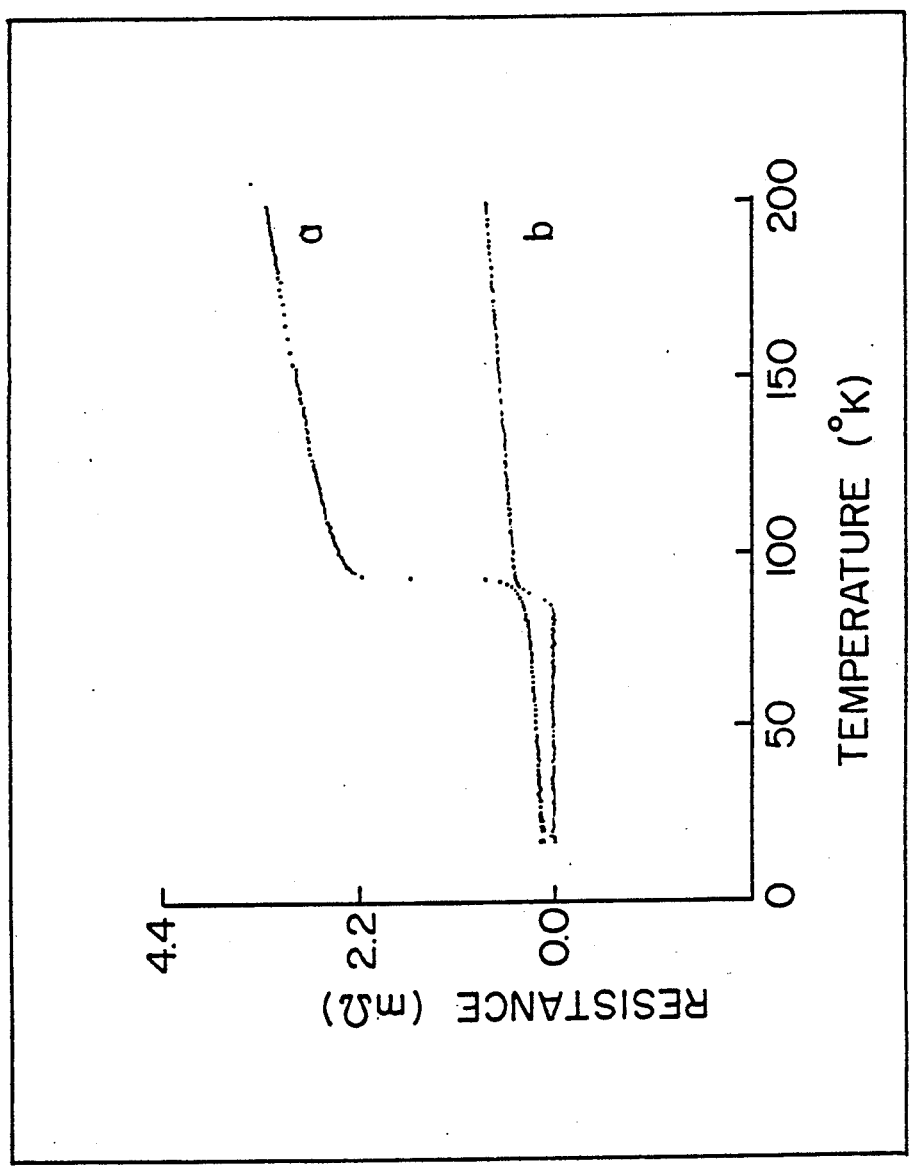

FIG. 2b represents a comparison of the electrical transport properties for YBCO+11% by weight silver composites prepared in two different ways:
 a) By random mixture of $AgO_2$ and YBCO followed by sintering at 600° C. for four hours in an oxygen rich atmosphere.
 b) By plating YBCO with silver in an electroless process and then pelleting and sintering at 600° C. for 4 hours in an oxygen rich atmosphere. It is readily observed that the random composite does not reach the zero resistance state while the new composite does. Also the new composite exhibits lower resistance in the normal state above $T_c$.

EXAMPLE 2

The Meissner effect in YBCO pellet, sintered at 940° C. under oxygen rich atmosphere, was measured for a magnetic field of H=50 oersted and at 4.2° K. Similar measurements were done on the new YBCO+Ag composites containing 11%, 20% and 32% silver by weight which were sintered at 500° C. and at 900° C. in an oxygen rich atmosphere for four hours. Also the critical transition temperatures (Tc) to the diamagnetic state were measured. The results are summerised in Table I. In this table the measured magnetic moments per unit weight and the measured densities are also presented. The new composites of YBCO+Ag compare well both in Meissner effect and in transition temperature to the pure YBCO material sintered at 940° C.

EXAMPLE 3

Figure 3:
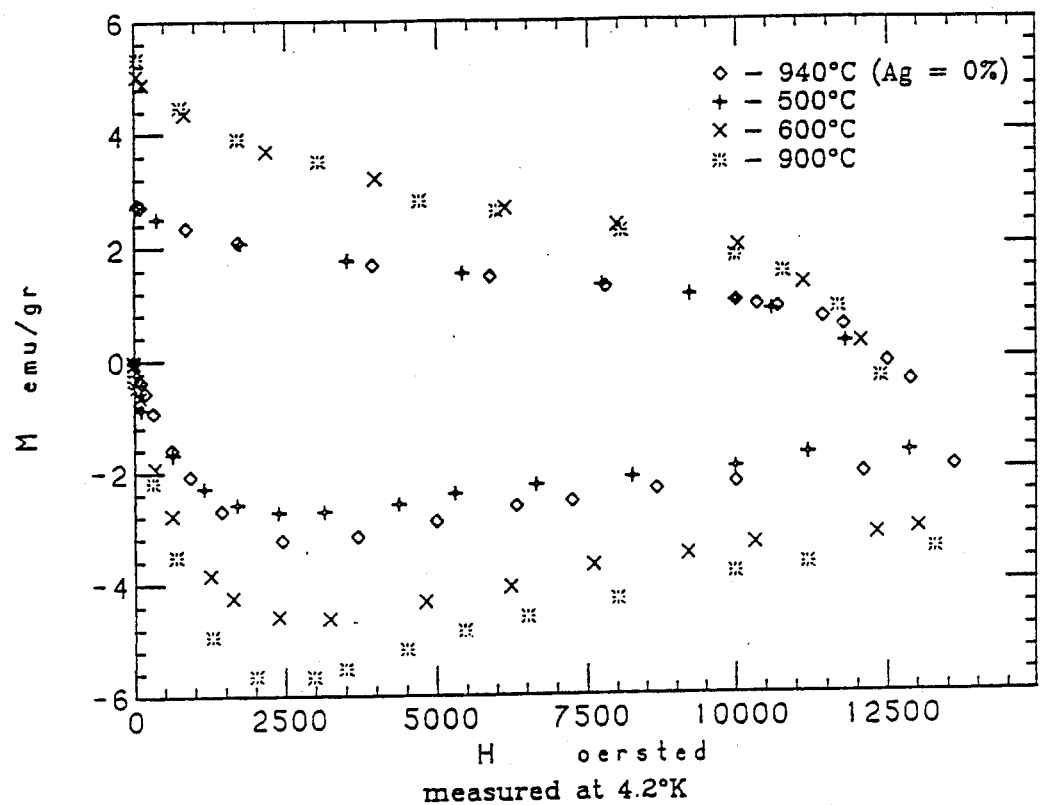
FIG. 3 is a graph related to Example 3.

The critical current magnitude was compared for the new YBCO +Ag composites containing 20% silver by weight as function of the sintering temperature. This comparison was done by measuring the gradient of the induction in the samples (dB/dr) for different magnetic fields (H) using the difference ΔM(H) of the magnetization, M, obtained in a given field H and measured at 4.2° K. for increasing and decreasing fields (3,4), and using the fact that the critical current is proportional to ΔM(H). Inspection of FIG. 3 shows that by increasing the value of the sintering temperature, the ΔM(H) is increased. It is evident that the YBCO+20% Ag composite sintered at 900° C. for four hours in an oxygen rich atmosphere exhibits larger ΔM value for all the measured range of the magnetic field (H), than the pure YBCO material sintered at 940° C.

EXAMPLE 4

Figure 4:
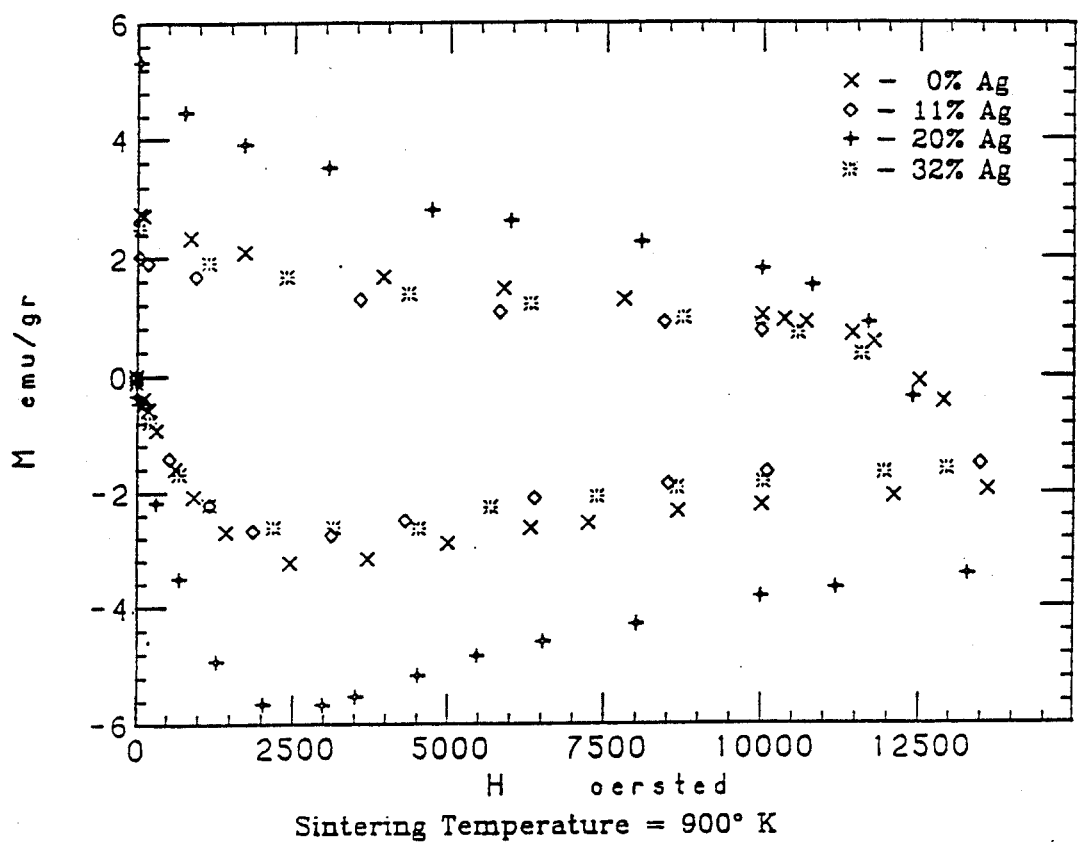
FIG. 4 is a graph related to Example 4.

Similar measurements as in previous example were performed as function of silver content at 4.2° K. for the new YBCO+Ag composites sintered in an oxygen rich atmosphere at 900° C. for a time period of four hours, see FIG. 4. The optimal ΔM (H) is observed for an YBCO+Ag composite containing −20% silver by weight. For comparison also the results for pure YBCO material sintered at 940° C. are shown.

EXAMPLE 5

Figure 5:
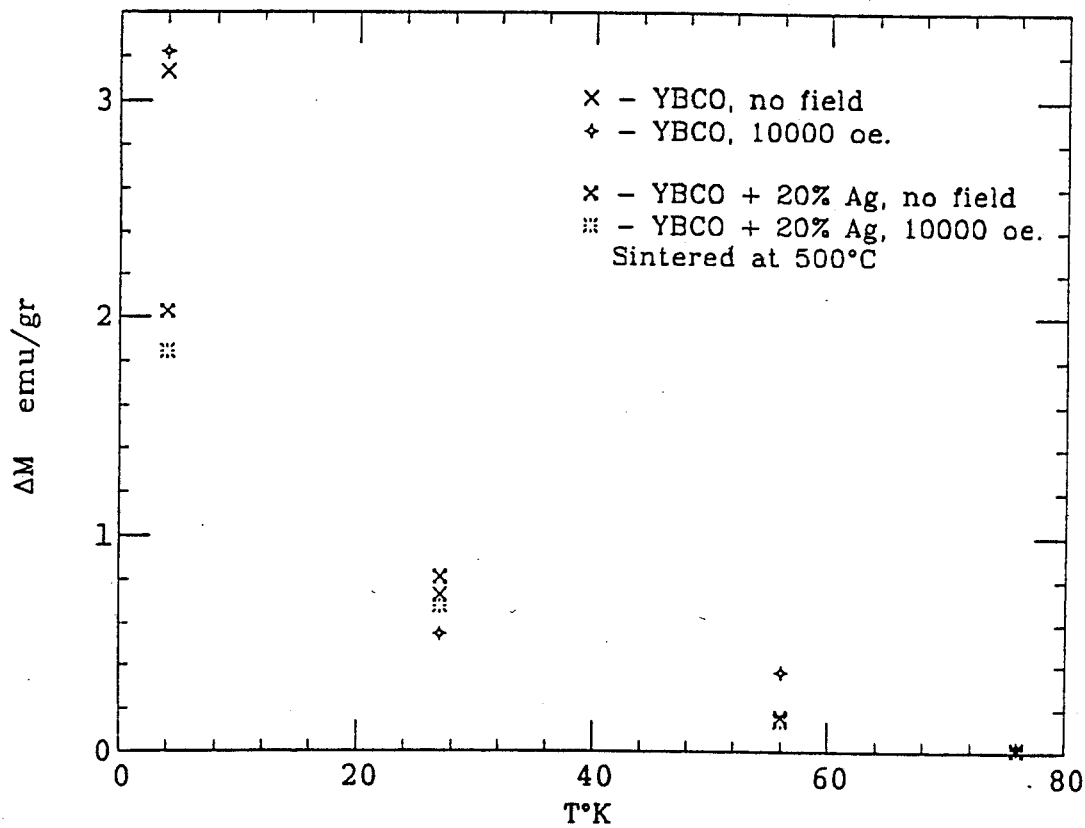
FIG. 5 is a graph related to Example 5.

ΔM(H) as function of temperature (4.2° K–80° K) was measured for YBCO pure material sintered at 940° C. for the new YBCO+20% Ag composite sintered at 500° C. This was done for two values of the magnetic field; H=0 and H=10.000 oersted, see FIG. 5. An exponential comparable decrease in the value of M(H) is observed in both materials.

EXAMPLES 6

Figures 6A, 6B:
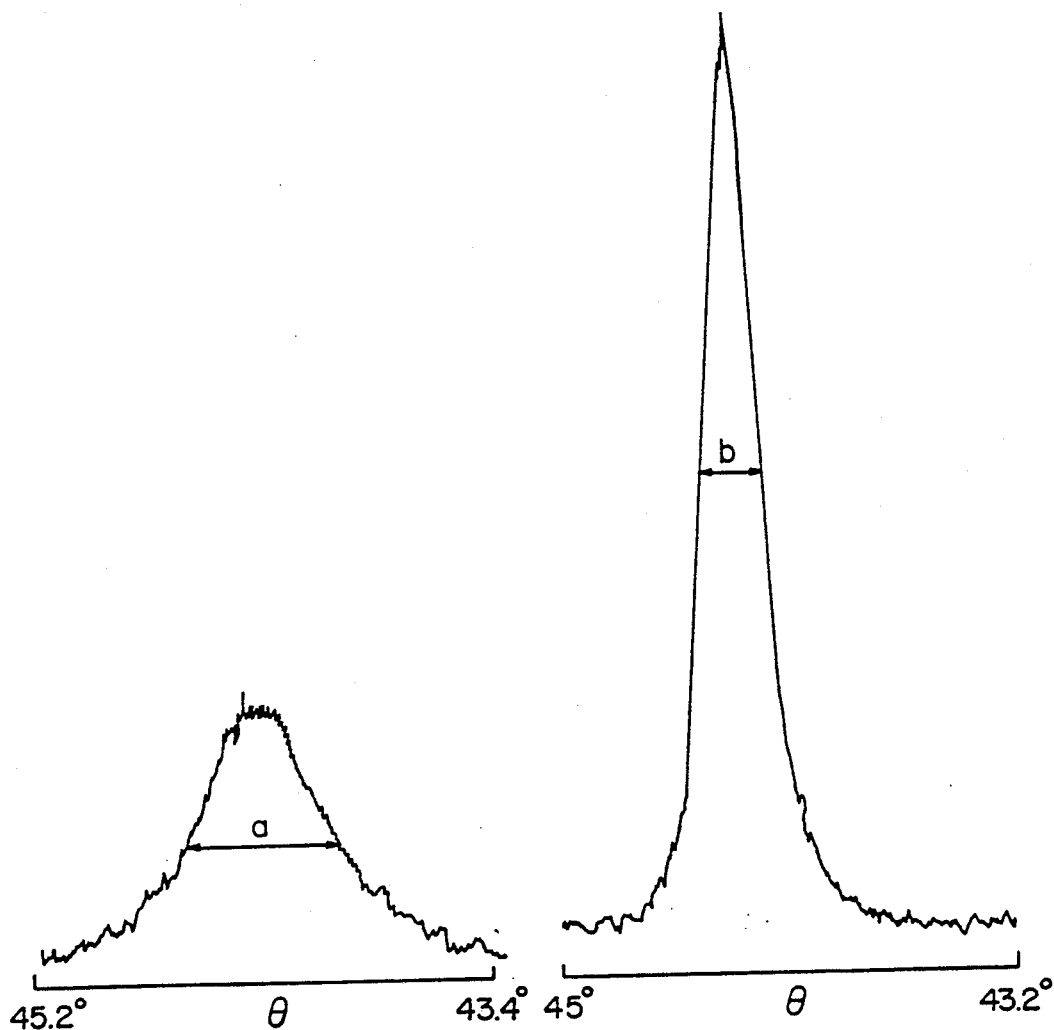
FIGS. 6a and 6b are graphs related to Example 6.

To follow the sintering process for the silver metal, in the new YBCO+Ag composites the (2,0,0) x-ray reflection was measured in a pellet containing 32% silver by weight. This reflection was monitored before sintering; FIG. 6a, and after sintering for a period of four hours in an oxygen rich atmosphere at 450° C, FIG. 6b. A marked narrowing of the 2,0,0) x-ray reflection is observed as a result of the sintering process.

EXAMPLE 7

$EuBa_2Ca_3O_{7-x}$ powder (−5μm grains) was coated with silver by the same electroless process that was used for the YBCO powder. The resulting silver coated powder was pressed into a pellet form using a pressure of 10 tons/cm². This pellet was sintered for 4h in an oxygen rich atmosphere of 920° C. The new silver superconductor composite exhibited a transition to the diamagnetic state at 93±1° K.

TABLE 1

Meissner at 50 oersted, and $T_c$ for Composites of YBCO and Ag

| Material | Sintering Temperature | M emu/gr | ρ gr/cm³ | Meissner % | $T_c$ °K |
|---|---|---|---|---|---|
| YBCO | 940° C. | 0.1262 | 5.10 | 16.1 | 93 ± 0.5 |
| YBCO + 11% Ag | 500° C. | 0.1250 | 4.86 | 15.3 | 94 ± 1 |
| YBCO + 20% Ag | 500° C. | 0.1120 | 5.47 | 15.4 | 94 ± 1 |
| YBCO + 32% Ag | 500° C. | 0.0884 | 5.95 | 13.2 | 94 ± 1 |
| YBCO + 11% Ag | 900° C. | 0.1070 | 5.21 | 14.0 | 93 ± 1 |
| YBCO + 20% Ag | 900° C. | 0.0967 | 5.63 | 13.7 | 94 ± 1 |
| YBCO + 32% Ag | 900° C. | 0.0942 | 6.23 | 14.7 | 94 ± 1 |

REFERENCES

1. F.H. Streitz, M.Z. Cieplak, Gang Xiao, A. Gavrin, A. Bakhshai and C.L. Chien "Superconductivity of Au-Y Ba₂Cu₃O₇ Composites" Appl. Phys. Lett. 52, 927 (1988).
2. S. Jin, R.C. Sherwood, T.H. Tiefel, G.W. Kammlott, R.A. Fasnacht, M.E. Davis and S.M. Zahurak "Superconductivity in the Bi-Sr-Ca-Cu-O compounds with noble metal additions." Appl. Phys. Lett. submitted (1988).
3. J. Friedel, P.G. DeGennes, J. Matricon "Nature of the Driving Force in Flux Creep Phenomena." Appl. Phys. letters 119, 2 (1963).
4. C.P. Bean, "Magnetization of Hard Superconductors" Phys. Rev.. Lett. 250, 8 (1962).

I claim:

1. A continuous malleable superconductive material comprising a sintered metal-plated ceramic powder which material is machinable, can be rolled and soldered, wherein there exists a continuous phase of said metal, and which is obtained by application of pressure sintering in an oxidizing atmosphere of said metal-plated powder of a ceramic material, which material behaves as superconductor below a critical temperature.

2. A material according to claim 1, where said ceramic is $QBa_2Cu_3O_{7-x}$, where Q is selected from the group consisting of yttrium, europium, and mixtures thereof, and where said metal is silver which is applied to said ceramic is an electroless plating process.

3. A material according to claim 2, wherein particles of the ceramic powder are in the micron size range, where the silver comprises from about 5 to 32 weight-% and where the sintering is effected at an elevated temperature in an oxygen containing atmosphere.

4. A material according to claim 3, being the product of a process where the sintering is effected at a pressure in the tons/cm² range and where the sintering is at a temperature between about 350° C. to about 950°.

5. A material according to claim 1, in the form of a thin flexible sheet.

6. A material according to claim 5, where the flexible sheet is supported by a suitable flexible support.

7. A material according to claim 4, being the product of a process wherein the sintering temperature is 400° C.-900° C.

* * * * *